(12) United States Patent
Kim et al.

(10) Patent No.: US 9,079,304 B2
(45) Date of Patent: Jul. 14, 2015

(54) TRANSFER UNIT, METHOD FOR CONTROLLING THE TRANSFER UNIT, AND APPARATUS AND METHOD FOR TREATING SUBSTRATE USING THE TRANSFER UNIT

(71) Applicant: SEMES CO. LTD., Cheonan-si (KR)

(72) Inventors: Woosung Kim, Cheonan-si (KR); Myungchan Cho, Cheonan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 121 days.

(21) Appl. No.: 14/065,730

(22) Filed: Oct. 29, 2013

(65) Prior Publication Data

US 2014/0121831 A1    May 1, 2014

(30) Foreign Application Priority Data

Oct. 31, 2012  (KR) .......................... 10-2012-0122484
Dec. 28, 2012  (KR) .......................... 10-2012-0156280

(51) Int. Cl.
| | |
|---|---|
| G06F 19/00 | (2011.01) |
| B25J 9/16 | (2006.01) |
| B25J 11/00 | (2006.01) |
| H01L 21/67 | (2006.01) |
| H01L 21/677 | (2006.01) |
| H01L 21/687 | (2006.01) |

(52) U.S. Cl.
CPC ............ *B25J 9/1651* (2013.01); *B25J 11/0075* (2013.01); *B25J 11/0095* (2013.01); *H01L 21/67276* (2013.01); *H01L 21/67742* (2013.01); *H01L 21/68707* (2013.01)

(58) Field of Classification Search
USPC .......................... 700/245, 248, 250, 252, 260
See application file for complete search history.

(56) References Cited

U.S. PATENT DOCUMENTS

| | | | | |
|---|---|---|---|---|
| 6,450,755 | B1 * | 9/2002 | Cameron et al. | 414/416.08 |
| 2007/0131256 | A1 * | 6/2007 | Nanba et al. | 134/33 |
| 2010/0322745 | A1 * | 12/2010 | Kobiki | 414/225.01 |
| 2012/0101633 | A1 * | 4/2012 | Rodnick | 700/253 |

FOREIGN PATENT DOCUMENTS

| | | |
|---|---|---|
| KR | 1020090035101 A | 4/2009 |
| KR | 1020100018375 A | 2/2010 |
| KR | 20100025855 A | 3/2010 |
| KR | 20100025857 A | 3/2010 |

* cited by examiner

*Primary Examiner* — Ian Jen
(74) *Attorney, Agent, or Firm* — Carter, DeLuca, Farrell & Schmidt, LLP (57) ABSTRACT

Provided is a transfer unit. The transfer unit includes a robot transferring a substrate and a controller controlling a speed of the robot according to the number of substrates to be transferred by the robot for a preset period. When the number of substrates to be transferred for the preset period increases, the robot increases in moving speed by the controller.

24 Claims, 6 Drawing Sheets

| Robot Speed (%) | 10 | 20 | 30 | 40 | 50 | 60 | 70 | 80 | 90 | 100 |
|---|---|---|---|---|---|---|---|---|---|---|
| Power (KW) | 0.2 | 0.3 | 0.4 | 0.5 | 0.7 | 0.8 | 1.1 | 1.2 | 1.2 | 1.5 |
| Current (A) | 1.3 | 1.8 | 2.5 | 3.2 | 4.3 | 5.8 | 7.5 | 9.1 | 10.8 | 14.3 |
| Productivity (Wafer/Hour) | 104 | 178 | 227 | 266 | 296 | 321 | 337 | 360 | 369 | 373 |

Operation at variable robot speed (10-90%)

Operation at fixed robot speed (90%)

Fig. 6

TRANSFER UNIT, METHOD FOR CONTROLLING THE TRANSFER UNIT, AND APPARATUS AND METHOD FOR TREATING SUBSTRATE USING THE TRANSFER UNIT

CROSS-REFERENCE TO RELATED APPLICATIONS

This U.S. non-provisional patent application claims priority under 35 U.S.C. §119 of Korean Patent Application Nos. 10-2012-0122484, filed on 31 Oct. 2012, and 10-2012-0156280, filed on 28 Dec. 2012, the entire contents of which are hereby incorporated by reference.

BACKGROUND OF THE INVENTION

The present invention disclosed herein relates to a substrate treating apparatus, and more particularly, to a method for controlling a speed of a transfer unit that treats a substrate such as a wafer used for manufacturing a semiconductor device or a glass substrate used for manufacturing a flat panel display device.

A series of processes including a process of forming a resist layer on a substrate, a process of exposing the resist layer by using a photomask, and a process of developing the exposed resist layer to form a desired pattern is performed as one of processes for manufacturing semiconductor devices or flat panel displays. The above-described treating process may be performed by using equipment in which an exposure device is connected to a coating/developing device for applying/developing a resist solution.

In general, such substrate treating equipment includes a load port, an index module, a buffer module, and a process module. A transfer robot for transferring a substrate into the other module or into each of chambers within the same module is provided in each of the modules.

The transfer robot always consumes energy for equipment productivity to be maximized. Thus, the transfer robot may operate at full speed and with parameters adequate for the full speed thereof. This is the same even in case of where the throughput to be treated in the equipment decreases. As a result, since the transfer robot operates adequate for the maximum throughput even though the throughput to be treated in the equipment decreases, unnecessary energy may be consumed always.

SUMMARY OF THE INVENTION

The present invention provides a method for controlling a speed of a transfer unit to optimize energy consumption of the transfer unit.

The object of the present invention is not limited to the aforesaid, but other objects not described herein will be clearly understood by those skilled in the art from descriptions below.

Embodiments of the present invention provide transfer units including: a robot transferring a substrate; and a controller controlling a speed of the robot according to the number of substrates to be transferred by the robot for a preset period, wherein, the number of substrates to be transferred for the preset period increases, the robot increases in moving speed by the controller.

In some embodiments, the controller may preset the moving speed of the robot to correspond to the number of substrates to be transferred for the preset period, and when the number of substrates is inputted, the robot may move at the preset moving speed.

In other embodiments, the transfer units may further include a guide rail disposed in one direction, wherein the robot may include: a mounting board that is linearly movable along the guide rail; a support disposed vertically and coupled to the mounting board; an arm vertically movable along the support, the arm being rotatable about the support and movable forward and backward; and a hand on which the substrate is placed, the hand being coupled to a front end of the arm, wherein the controller may control only one speed of a linear moving speed of the mounting board, a vertical moving speed of the arm, a rotational speed of the arm, and a forward/backward moving speed of the arm so that the one speed increases.

In still other embodiments, wherein the controller may control a moving speed of the component having the longest moving distance in the linear moving speed of the mounting board, the vertical moving speed of the arm, the rotational speed of the arm, and the forward/backward moving speed of the arm so that the moving speed of the component increases.

In even other embodiments, the transfer units may further include a guide rail disposed in one direction, wherein the robot may include: a mounting board that is linearly movable along the guide rail; a support disposed vertically and coupled to the mounting board; an arm vertically movable along the support, the arm being rotatable about the support and movable forward and backward; and a hand on which the substrate is placed, the hand being coupled to a front end of the arm, wherein the controller may control at least one moving speed of a linear moving speed of the mounting board, a vertical moving speed of the arm, a rotational speed of the arm, and a forward/backward moving speed of the arm so that the at least one moving speed increases.

In yet other embodiments, the transfer units may further include a guide rail disposed in one direction, wherein the robot may include: a plurality of hands on which the substrate is placed, the plurality of hands being disposed to face each other; a hand driving unit allowing the hands to horizontally move; a support supporting the hand driving unit; a vertical moving unit allowing the support to vertically move and rotate; and a horizontal moving unit supporting the vertical moving unit, the horizontal moving unit being movable along the guide rail, wherein the controller may control at least one speed of a linear moving speed of each of the hands, a vertical moving speed of the support, a rotational speed of the support, and a moving speed of the horizontal moving unit so that the at least one speed increases.

In further embodiments, the controller may change the moving speed of the robot in proportion to the number of substrates to be treated for the preset period.

In other embodiments of the present invention, substrate treating apparatuses include: a plurality of chambers in which processes with respect to a substrate are performed; and a transfer unit transferring the substrate to the chambers, wherein the transfer unit includes: a guide rail disposed in one direction; a robot moving along the guide rail, the robot transferring the substrate; and a controller controls a speed of the robot according to the number of substrates to be treated in the chambers for a preset period.

In some embodiments, the controller may control the moving speed of the robot so that the moving speed of the robot increases as the number of substrates to be process-treated in the chamber for the preset period increases.

In other embodiments, the controller may preset the moving speed of the robot to correspond to the number of substrates to be process-treated in the chambers for the preset period, and when the number of substrates is inputted, the robot may move at the preset moving speed.

In still other embodiments, the robot may include: a mounting board that is linearly movable along the guide rail; a support disposed vertically and coupled to the mounting board; an arm vertically movable along the support, the arm being rotatable about the support and movable forward and backward; and a hand on which the substrate is placed, the hand being coupled to a front end of the arm, wherein the controller may control at least one moving speed of a linear moving speed of the mounting board, a vertical moving speed of the arm, a rotational speed of the arm, and a forward/backward moving speed of the arm so that the at least one moving speed increases.

In even other embodiments, the controller may control a moving speed of the component having the longest moving distance in the linear moving speed of the mounting board, the vertical moving speed of the arm, the rotational speed of the arm, and the forward/backward moving speed of the arm so that the moving speed of the component increases.

In yet other embodiments, the robot may include: a plurality of hands on which the substrate is placed, the plurality of hands being disposed to face each other; a hand driving unit allowing the hands to horizontally move; a support supporting the hand driving unit; a vertical moving unit allowing the support to vertically move and rotate; and a horizontal moving unit supporting the vertical moving unit, the horizontal moving unit being movable along the guide rail, wherein the controller may control at least one speed of a linear moving speed of each of the hands, a vertical moving speed of the support, a rotational speed of the support, and a moving speed of the horizontal moving unit so that the at least one speed increases.

In further embodiments, the controller may change a moving speed of the component having the longest moving distance in the linear moving speed of each of the hands, the vertical moving speed of the support, the rotational speed of the support, and the horizontal moving speed of the horizontal moving unit so that the moving speed of the component increases.

In still other embodiments of the present invention, methods for controlling a speed of a robot for transferring a substrate include: controlling the moving speed of the robot according to the number of substrates to be treated for a preset period, wherein, when the number of substrates to be treated for the preset period increases, the robot increases in moving speed.

In some embodiments, the moving speed of the robot may be preset to correspond to the number of substrates to be treated for the preset period, and when a controller receives the number of substrates, the controller may control the robot so that the robot moves at the preset moving speed.

In other embodiments, the preset period may be a day unit.

In still other embodiments, the robot may include a mounting board, a support, an arm, and a hand, wherein at least one moving speed of a horizontal moving speed of the mounting board along the guide rail in a horizontal direction, a vertical moving speed of the arm along the support coupled to the mounting board in a vertical direction, a rotational speed of the arm about the support, and a linear moving speed of the hand in forward and backward directions due to contraction of the arm may be controlled to increase.

In even other embodiments, the moving speed of the component having the longest moving distance in the horizontal moving speed, the vertical moving speed, the rotational moving speed, and the linear moving speed may be controlled to increase.

In yet other embodiments, wherein the moving speed of the robot may be changed to increase in all of the horizontal moving speed, the vertical moving speed, the rotational moving speed, and the linear moving speed.

In further embodiments, the moving speed of the robot may increase in proportion to the number of substrates to be treated for the preset period.

In even other embodiments of the present invention, methods for treating a plurality of substrates for a preset period include: moving a robot to provide each of the substrates to the chamber; and treating the substrate in the chamber, wherein the robot is controlled in moving speed according to the number of substrates to be treated fro the preset period.

In some embodiments, the moving speed of the robot may be preset to correspond to the number of substrate, and when a controller receives the number of substrates, the controller controls the robot so that the robot may move at the preset moving speed.

In other embodiments, the moving speed of the robot may increase in proportion to the number of substrates to be treated for the preset period.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 1 to 4 are schematic views of a substrate treating apparatus according to an embodiment of the present invention;

DETAILED DESCRIPTION OF PREFERRED EMBODIMENTS

Hereinafter, exemplary embodiments of the present invention will be described in detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the thicknesses of layers and regions are exaggerated for clarity.

An apparatus according to the current embodiment may be used for performing a photolithograph process on a substrate such as a semiconductor wafer or flat panel display. In detail, the apparatus according to the current embodiment may be used for performing a coating process and developing process on a substrate Hereinafter, a wafer is exemplified as the substrate.

Figure 1:
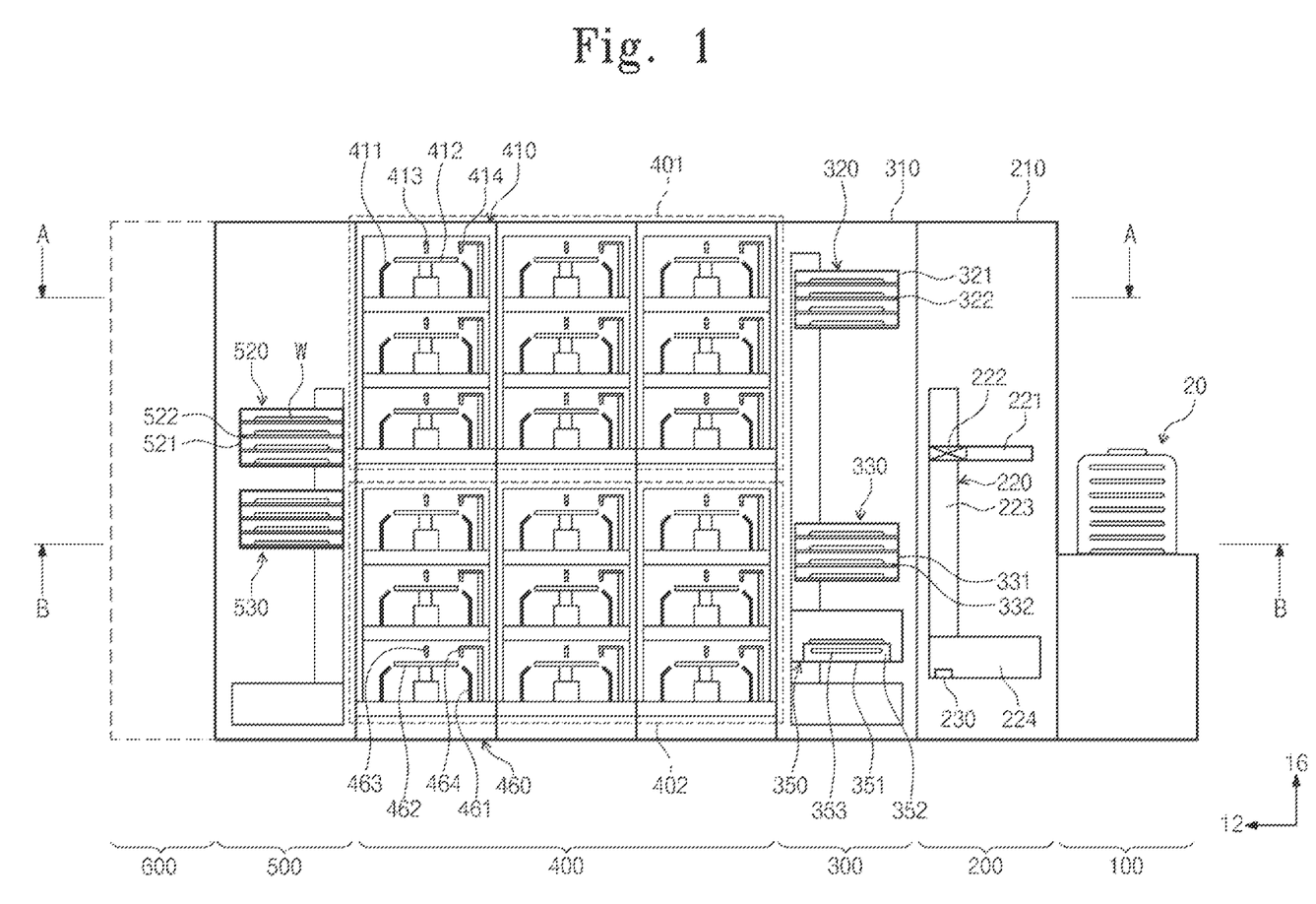
FIG. 1 is a side cross-sectional view of the substrate treating apparatus.
Figure 2:
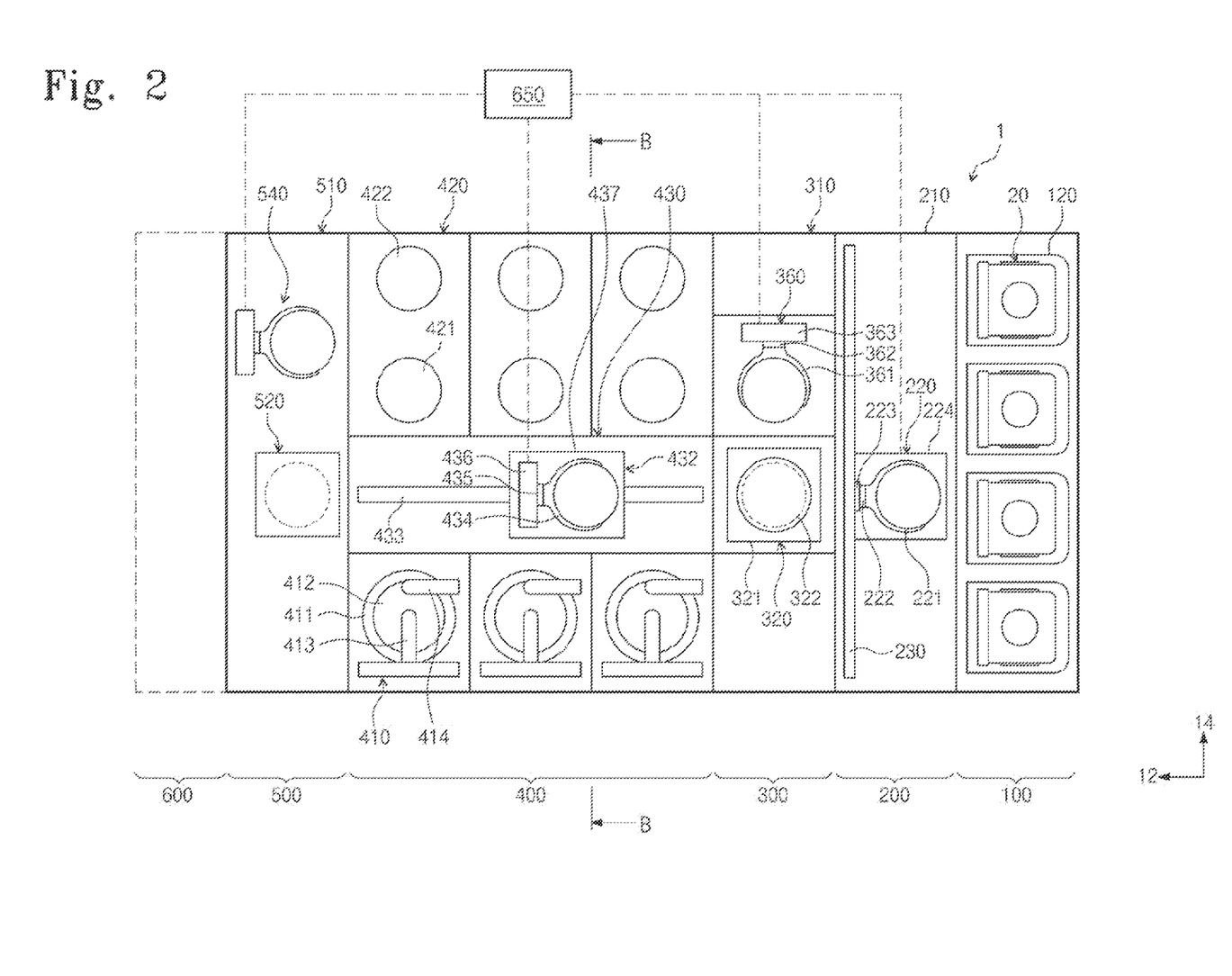
FIG. 2 is a cross-sectional view taken along line A-A of FIG. 1.
Figure 3:
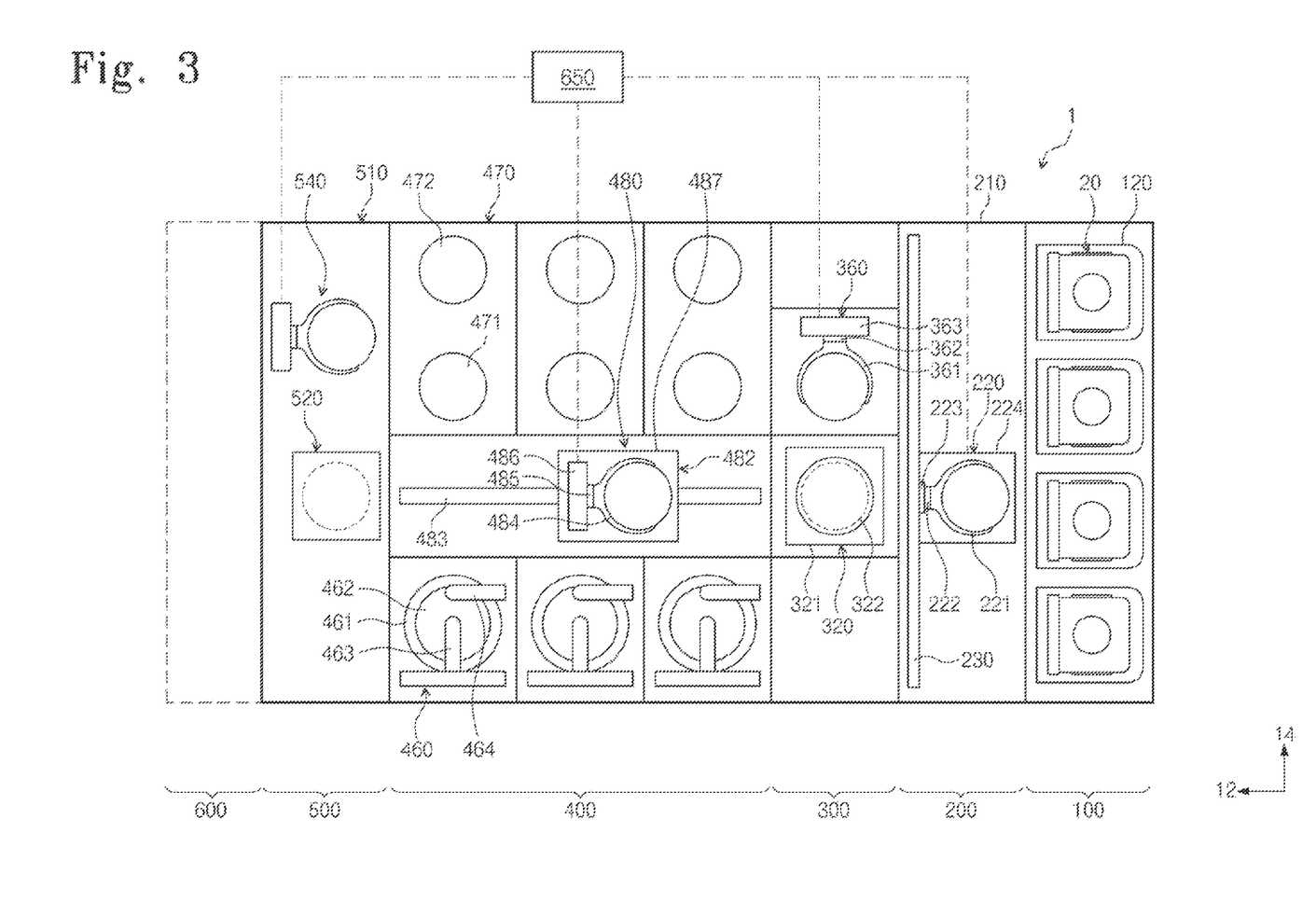
FIG. 3 is a cross-sectional view taken along line B-B of FIG. 1.
Figure 4:
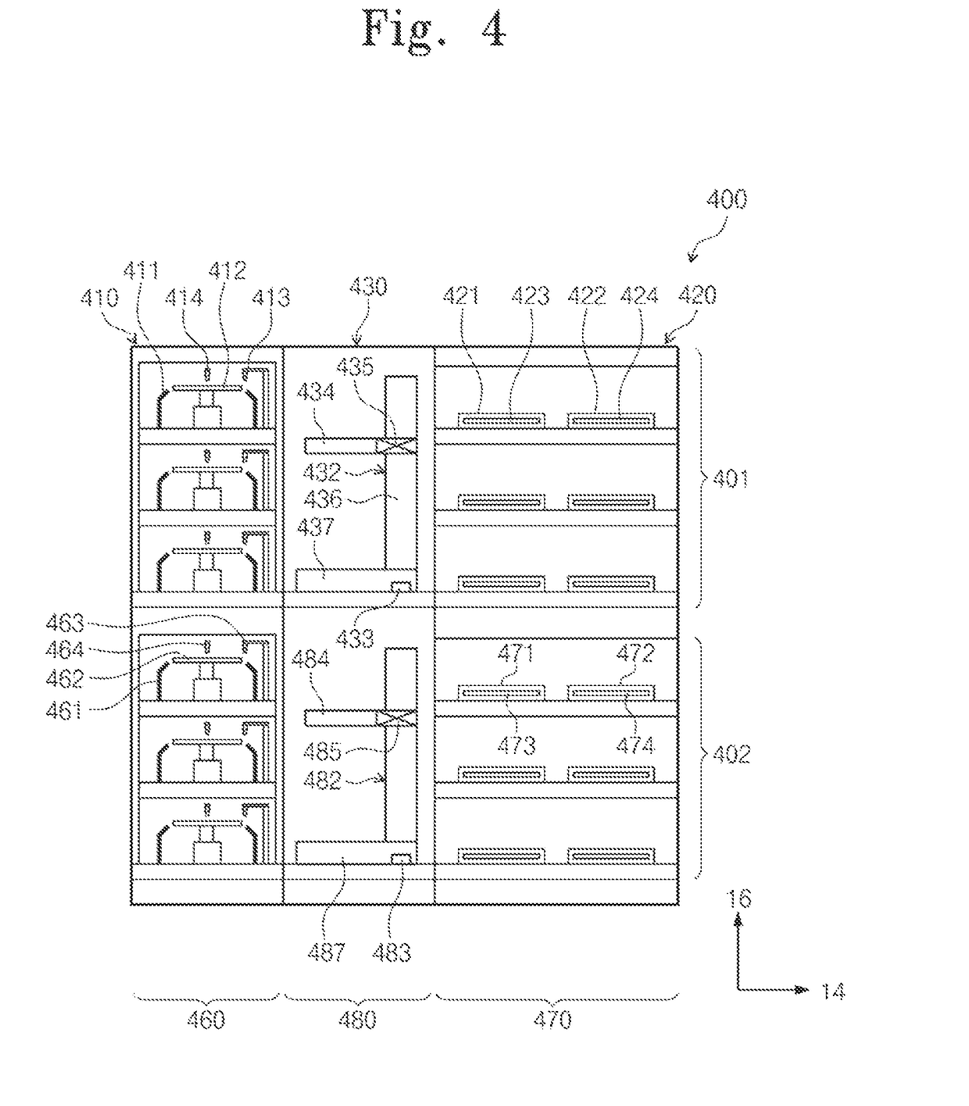
FIG. 4 is a cross-sectional view taken along line C-C of FIG. 2.

FIGS. 1 to 4 are schematic views of a substrate treating apparatus 1 according to an embodiment of the present invention. FIG. 1 is a side cross-sectional view of the substrate treating apparatus, FIG. 2 is a cross-sectional view taken along line A-A of FIG. 1, FIG. 3 is a cross-sectional view taken along line B-B of FIG. 1, and FIG. 4 is a cross-sectional view taken along line C-C of FIG. 2.

The substrate treating apparatus 1 includes a load port 100, an index module 200, a buffer module 300, a process module 400, and an interface module 500. The load port 100, the index module 200, the buffer module 300, the process module 400, and the interface module 500 are successively arranged in a line. Hereinafter, a direction in which the index module 200, the buffer module 300, the process module 400, and the interface module 500 are arranged may be called a first direction 12, and a direction perpendicular to the first direction 12 when viewed from an upper side may be called a second direction 14. Also, a direction perpendicular to each of the first and second directions 12 and 14 may be called a third direction 16.

A wafer W may move in a state where the wafer W is accommodated in a lot 20. Here, the lot 20 may have a structure that is sealable from the outside. For example, a front open unified pod (FOUP) having a front door may be used as the lot 20. Hereinafter, the respective components will be described in detail with reference to FIGS. 1 to 4.

The load port 100 includes a mounting platform 120 on which the lot 20 in which wafers W are accommodated is placed. The mounting platform 120 may be provided in plurality. The plurality of mounting platforms 200 are arranged in a line along the second direction 14. Four mounting platforms 120 are illustrated in FIG. 2.

The index module 200 transfers the wafer W between the lot 20 placed on the mounting platform 120 of the load port 100 and the buffer module 300. The index module 200 includes a frame 210, an index robot 220, and a guide rail 230. The frame 210 has an approximately rectangular shape having an empty inner space. Also, the frame 210 is disposed between the load port 100 and the buffer module 300. The frame 210 of the index module 200 may be disposed at a height less than that of a frame 310 (that will be described later) of the buffer module 300. Although not shown, a door opener for opening or closing a door of the slot 20 may be further provided on the frame 210. The index robot 220 and the guide rail 230 are disposed within the frame 210. The index robot 220 may have a four-axis driving structure in which a hand 221 for directly handling the wafer W is movable in first, second, and third directions 12, 14, and 16 and also rotatable. The index robot 220 includes a hand 221, an arm 222, and a support 223, and a mounting board 224. The hand 221 is fixed to the arm 222. The arm 222 may have a flexible structure and a rotatable structure with respect to the support 223. The support 223 has a longitudinal direction along the third direction 16. The arm 222 is coupled to the support 223 to move along the support 223. The support 223 is fixedly coupled to the mounting board 224. The guide rail 230 has a longitudinal direction along the second direction 14. The mounting board 224 is coupled to the guide rail 230 to linearly move along the guide rail 230.

The buffer module 300 includes a frame 310, a first buffer 320, a second buffer 330, a cooling chamber 350, and a buffer robot 360. The frame 310 has a rectangular shape having an empty inner space. Also, the frame 310 is disposed between the index module 200 and the process module 400. The first buffer 320, the second buffer 330, the cooling chamber 350, and the buffer robot 360 are disposed within the frame 310. The cooling chamber 350, the second buffer 330, and the first buffer 320 are successively disposed upward along the third direction 16 from a lower side. The first buffer 320 is disposed at a height corresponding to that of a coating module 401 (that will be described later) of the process module 400, and each of the second buffer 330 and the cooling chamber 350 is disposed at a height corresponding to that of a developing module 402 (that will be described later) of the process module 400. The buffer robot 360 is spaced a predetermined distance from each of the second buffer 330, the cooling chamber 350, and the first buffer 320 in the second direction 14.

Each of the first and second buffers 320 and 330 temporally stores the plurality of wafers W. The second buffer 330 includes a housing 331 and a plurality of supports 332. The supports 332 are disposed within the housing 331. Also, the supports 332 are spaced apart from each other in the third direction 16. One wafer W is placed on each of the supports 332. The housing 331 has openings (not shown) in a direction in which the index robot 220 is provided, a direction in which the buffer robot 360 is provided, and a direction in which a developing robot 482 (that will be described later) is provided so that the index robot 220, the buffer robot 360, and the developing the developing module 402 load or unload the wafer W onto/from the support 332 disposed within the housing 331. The first buffer 320 may have a structure substantially similar to that of the second buffer 330. However, a housing 321 of the first buffer 320 has openings in a direction the buffer robot 360 is provided and in a direction a coating robot 432 (that will be described later) disposed in the coating module 401 is provided. The number of supports 322 provided on the first buffer 320 may be equal to or different from that of supports 332 provided on the second buffer 330. For example, the number of supports 332 provided on the second buffer 330 may be greater than that of supports 322 provided on the first buffer 320.

The buffer robot 360 transfers the wafer W between the first buffer 320 and the second buffer 330. The buffer robot 360 includes a hand 361, an arm 362, and a support 363. The hand 361 is fixed to the arm 362. The arm 362 has a flexible structure to allow the hand 361 to be movable along the second direction 14. The arm 362 is coupled to the support 363 to linearly move along the support 363 in the third direction 16. The support 363 has a length extending from a position corresponding to that of the second buffer 330 up to a position corresponding to that of the first buffer 320. The support 363 may have a length that further extends in a downward direction than an upward direction. The first buffer robot 360 may be provided so that the hand 361 is driven by only two axes along the second and third directions 14 and 16.

The cooling chamber 350 may cool the wafer W. The cooling chamber 350 includes a housing 351 and a cooling plate 352. The cooling plate 352 includes a top surface on which the wafer W is placed and a cooling unit 353 cooling the wafer W. The cooling unit 353 may cool the wafer W through various methods by using coolant or a thermoelectric element. Also, a lift pin assembly (not shown) for positioning the wafer W on the cooling plate 352 may be provided in the cooling chamber 350. The housing 351 has openings (not shown) in a direction in which the index robot 220 is provided and a direction in which the developing robot 462 is provided so that the index robot 220 and the developing robot 482 of the developing module 402 load or unload the wafer W onto/from the cooling plate 352. Also, doors (not shown) for opening the above-described openings may be provided on the cooling chamber 350.

A coating process for applying a photoresist on the wafer W and a developing process for developing the wafer W after the exposure process are performed in the process module 400. The process module 400 has an approximately rectangular shape. The process module 400 includes the coating module 401 and the developing module 402. The coating module 401 and the developing module 402 are partitioned with respect to each other. For example, the coating module 401 may be disposed above the developing module 402.

A process for applying sensitizing solution such as a photoresist solution on the wafer W and a thermal treating process for heating and cooling the wafer W before and after the resist coating process may be performed in the coating module 401. The coating module 401 includes a resist coating chamber 410, a bake chamber 420, and a transfer chamber 430. The resist coating chamber 410, the bake chamber 420, and the transfer chamber 430 are successively arranged in the second direction 14. Thus, the resist coating chamber 410 and the bake chamber 420 are spaced apart from each other in the second direction 14 with the transfer chamber 430 therebetween. The resist coating chamber 410 may be provided in plurality. That is, the resist coating chamber 410 may be provided in plurality in each of the first and third directions 12 and 16. In the drawings, six resist coating chambers are provided as an example. The bake chamber 420 may be provided in plurality in each of the first and third directions 12 and 16. In the drawings, six bake chambers 420 are provided as an example. Alternatively, more bake chambers 420 may be provided.

The transfer chamber 430 is disposed parallel to the first buffer 320 of the buffer module 300 in the first direction 12. The coating robot 432 and a guide rail 433 are disposed within the transfer chamber 430. The transfer chamber 430 has an approximately rectangular shape. The coating robot 432 transfers the wafer W between the bake chambers 420, the resist coating chambers 400, the first buffer 320 of the buffer module 300, and a first buffer 520 (that will be described later) of the interface module 500. The guide rail 433 has a longitudinal direction parallel to the first direction 12. The guide rail 433 guides the coating robot 432 so that the coating robot 432 linearly moves in the first direction 12. The coating robot 432 includes a hand 434, an arm 435, a support 436, and a mounting board 437. The hand 434 is fixed to the arm 435. The arm 435 has a flexible structure to allow the hand 434 to be movable in a horizontal direction. The support 436 has a longitudinal direction along the third direction 16. The arm 435 is coupled to the support 436 to linearly move along the support 436 in the third direction 16. The support 436 is fixedly coupled to the mounting board 437, and the mounting board 437 is coupled to the guide rail 433 to move along the guide rail 433.

The resist coating chambers 410 may have the same structure. However, kinds of photoresist used in the resist coating chambers 410 may be different from each other. For example, chemical amplification resist may be used as the photoresist. The photoresist may be applied onto the wafer W in the resist coating chamber 410. The photoresist coating chamber 410 includes a housing 411, a support plate 412, and a nozzle 413. The housing 411 has a cup shape with an opened upper side. The support plate 412 is disposed within the housing 411 to support the wafer W. The support plate 412 is rotatably provided. The nozzle 413 supplies the photoresist onto the wafer W placed on the support plate 412. The nozzle 413 has a circular tube shape. The nozzle 413 may supply the photoresist to a center of the wafer W. Selectively, the nozzle 413 may have a length corresponding to a diameter of the wafer W, and a discharge hole of the nozzle 413 may be provided in a slit shape. Also, a nozzle 414 for supplying a cleaning solution such as deionized water to clean a surface of the wafer W, which is coated with the photoresist, may be further provided in the resist coating chamber 410.

The wafer W is thermally treated in the bake chamber 420. For example, a prebake process for heating the wafer W at a predetermined temperature to remove organic matters or moisture from the surface of the wafer W after the photoresist is applied or a soft bake process performed after the photoresist is applied on the wafer W may be performed in each of the bake chambers 420. Also, after the heating process is performed, a cooling process for cooling the wafer W may be performed in each of the bake chambers 420. The bake chamber 420 includes a cooling plate 421 or a heating plate 422. A cooling unit 423 such as coolant or a thermoelectric element may be provided in the cooling plate 421. Also, a heating unit 424 such as a heating wire or a thermoelectric element may be provided in the heating plate 422. The cooling plate 421 and the heating plate 422 may be provided in one bake chamber 420. Selectively, one portion of the bake chambers 420 may include only the cooling plate 421, and the other portion may include only the heating plate 422.

The developing process for supplying a developing solution to remove a portion of the photoresist so as to form a desired pattern and a thermal treating process for heating and cooling the wafer W before and after the developing process may be performed in the developing module 402. The developing module 402 includes a developing chamber 460, a bake chamber 470, and a transfer chamber 480. The developing chamber 460, the bake chamber 470, and the transfer chamber 480 are successively arranged in the second direction 14. Thus, the developing chamber 460 and the bake chamber 470 are spaced apart from each other in the second direction 14 with the transfer chamber 480 therebetween. The developing chamber 460 is provided in plurality. That is, the developing chamber 460 may be provided in plurality in each of the first and third directions 12 and 16. In the drawings, six developing chambers 460 are provided as an example. The bake chamber 470 may be provided in plurality in each of the first and third directions 12 and 16. In the drawings, four bake chambers 470 are provided as an example. Alternatively, more bake chambers 470 may be provided.

The transfer chamber 480 is disposed parallel to the second buffer 330 of the buffer module 300 in the first direction 12. The developing robot 482 and a guide rail 483 are disposed within the transfer chamber 480. The transfer chamber 480 has an approximately rectangular shape. The developing robot 482 transfers the wafer W between the bake chambers 470, the developing chambers 460, the second buffer 330 of the buffer module 300, and a second buffer 530 of the interface module 500. The guide rail 483 has a longitudinal direction parallel to the first direction 12. The guide rail 483 guides the developing robot 482 so that the developing robot 482 linearly moves in the first direction 12. The developing robot 482 includes a hand 484, an arm 485, a support 486, and a mounting board 487. The hand 484 is fixed to the arm 485. The arm 485 has a flexible structure to allow the hand 484 to be movable in a horizontal direction. The support 486 has a longitudinal direction along the third direction 16. The arm 485 is coupled to the support 486 to linearly move along the support 436 in the third direction 16. The support 486 is fixedly coupled to the mounting board 487. The mounting board 487 is coupled to the guide rail 483 so that the mounting board 224 is linearly movable along the guide rail 483.

The developing chambers 460 may have the same structure. However, kinds of photoresist used in the developing chambers 460 may be different from each other. A region of the photoresist on which light is irradiated is removed in the developing chamber 460. Here, a region of a protection layer on which the light is irradiated may also be removed. Selectively, only regions of the photoresist and protection layer on which the light is not irradiated may be removed according to kinds of used photoresist.

The developing chamber 460 includes a housing 461, a support plate 462, and a nozzle 463. The housing 461 has a cup shape with an opened upper side. The support plate 462 is disposed within the housing 461 to support the wafer W. The support plate 462 is rotatably provided. The nozzle 463 supplies a developing solution onto the wafer W placed on the support plate 462. The nozzle 463 has a circular tube shape. The nozzle 413 may supply the developing solution to a center of the wafer W. Selectively, the nozzle 463 may have a length corresponding to the diameter of the wafer W, and a discharge hole of the nozzle 463 may be provided in a slit shape. Also, a nozzle 463 for supplying the cleaning solution such as the deionized water to clean the surface of the wafer W to which the developing solution is provided may be further provided in the developing chamber 460.

The wafer W is thermally treated in the bake chamber 470. For example, a soft bake process for heating the wafer W before the developing process, a hard bake process for heating the wafer W after the developing process, a cooling process for cooling the heated wafer W after the bake processes may be performed in each of the bake chambers 470. The bake chamber 470 includes a cooling plate 471 or a heating plate 472. A cooling unit 473 such as coolant or a thermoelectric element may be provided in the cooling plate 471. Also, a heating unit 424 such as a heating wire or a thermoelectric element may be provided in the heating plate 472. The cooling plate 471 and the heating plate 472 may be provided in one bake chamber 470. Selectively, one portion of the bake chambers 470 may include only the cooling plate 471, and the other portion may include only the heating plate 472.

The interface module 500 transfers the wafer W between the process module 400 and an exposure device 600. The interface module 500 includes a frame 510, a first buffer 520, a second buffer 530, and an interface robot 540. The first buffer 520, the second buffer 530, and the interface robot 540 are disposed within the frame 510. The first and second buffers 520 and 530 are spaced a predetermined distance from each other and stacked on each other. The first buffer 520 is disposed above the second buffer 530. The first buffer 520 is disposed at a height corresponding to that of the coating module 401, and the second buffer 530 is disposed at a height corresponding to that of the developing module 402. When viewed from an upper side, the first buffer 520 and the transfer chamber 430 of the coating module 401 are disposed in a line along the first direction 12. Also, the second buffer 530 and the transfer chamber 480 of the developing module 402 are disposed in a line along the first direction 12.

The interface robot 540 is spaced from the first and second buffers 520 and 530 in the second direction 14. The interface robot 540 transfers the wafer W between the first and second buffers 520 and 530 and the exposure device 600. The interface robot 540 may have a structure substantially similar to that of the buffer robot 360.

The first buffer 520 temporally stores the wafers W before the wafers W on which the process is performed in the coating module 401 moves to the exposure device 600. Also, the second buffer 530 temporally stores the wafers W before the wafers W on which the process is performed in the exposure device 600 moves to the developing module 402. The first buffer 520 includes a housing 521 and a plurality of supports 522. The supports 522 are disposed within the housing 521. Also, the supports 332 are spaced apart from each other in the third direction 16. One wafer W is placed on each of the supports 522. The housing 521 has openings (not shown) in a direction in which the interface robot 540 is provided and a direction in which the coating robot 432 is provided so that the interface robot 540 and the coating robot 432 load or unload the wafer onto/from a support 722 within the housing 521. The second buffer 530 may have a structure substantially similar to that of the first buffer 520. However, the housing 531 of the second buffer 530 has openings (not shown) in the direction in which the interface robot 540 is provided and the direction in which the developing robot 482 is provided. Only the above-described buffers and robots may be provided in the interface module 500 without providing the chambers in which the predetermined processes with respect to the wafer W are performed.

Hereinafter, a method for treating a wafer by using the above-described substrate treating apparatus 1 will be described.

A container 20 in which wafers W are accommodated is placed on a mounting platform 120 of a load port 100. A door of the container 20 is opened by a door opener. An index robot 220 takes a wafer W out of a lot 20 to transfer the wafer W to a second buffer 330. A buffer robot 360 transfers the wafer stored in the second buffer 330 to a first buffer 320. A coating robot 432 takes the wafer W out of the first buffer 320 to transfer the wafer W to a bake chamber 420 of the coating module 401. A prebake process and cooling process are successively performed in the bake chamber 420. The coating robot 432 takes the wafer W out of the bake chamber 420 to transfer the wafer W to a resist coating chamber 410. Photoresist may be applied onto the wafer W in the resist coating chamber 410. Thereafter, the coating robot 432 takes the wafer W out of the resist coating chamber 410 to transfer the wafer W to the bake chamber 420. A soft bake process with respect to the wafer W is performed in the bake chamber 420.

The coating robot 432 takes the wafer out of the bake chamber 420 to transfer the wafer to a first buffer 520 of an interface module 500. The interface robot 540 transfers the wafer W from the first buffer 520 to an exposure device 600. An exposing process with respect to the wafer W is performed in the exposure device 600. Thereafter, the interface robot 540 transfers the wafer W from the exposure device 600 to a second buffer 530.

A developing robot 482 takes the wafer W out of the second buffer 530 to transfer the wafer W to a bake chamber 470 of a developing module 402. A post bake process and cooling process are successively performed in the bake chamber 470. The developing robot 482 takes the wafer out of the bake chamber 470 to transfer the wafer W to a developing chamber 460. A developing process for supplying a developing solution on the wafer W is performed in the developing chamber 460. Thereafter, the developing robot 482 transfers the wafer W from the developing chamber 460 to the bake chamber 470. A hard bake process with respect to the wafer W is performed in the bake chamber 470.

The developing robot 482 takes the wafer W on which the bake process is performed to transfer a cooling chamber 350 of the buffer module 300. Then, the cooled wafer W is transferred to the first buffer 320 by the buffer robot 360. Thereafter, the wafer W is accommodated into a lot 220 by the index robot 220.

Among the above-described constitutions of the substrate treating apparatus 1, each of the index robot 220 and the guide rail 230 of the index module 200, the buffer robot 360 of the buffer module 300, the coating robot 432 and the guide rail 433 of the coating module 401, the developing robot 482 and the guide rail 483 of the developing module 402, and the interface robot 540 of the interface module 400 may be provided as a transfer unit for transferring the wafer W. The index robot 220 of the index module 200, the buffer robot 360 of the buffer module 300, the coating robot 432 of the coating module 401, the developing robot 482 of the developing module 402, and the interface robot 540 of the interface module 500 may be controlled in moving speed by a controller 650.

Hereinafter, a method for controlling a moving speed of each of the above-described robots by using the controller 650 will be described. A method for controlling a moving speed of the coating robot 432 of the coating module 401 by using the controller 650 will be exemplified, and also, technical ideas with respect to the above-described control method may be equally applied to other robots.

The process processing of the wafer W in the substrate treating apparatus 1 may be classified for a preset period unit. Also, the number of wafers W that have to be treated (hereinafter, referred to as "the number of wafers W to be treated") in the substrate treating apparatus 1 for a preset period may be changed. For example, the number of wafers W to be treated in the substrate treating apparatus 1 for one day may be about 1,000 sheets, and respectively, may be changed into about 500 sheets. The controller 650 may control the moving speed of the robot 432 according to the number of wafers W to be treated for the preset period. Thus, when the number of wafers W to be treated increases, the controller 650 controls the robot 432 so that the robot 432 increases in moving speed. The moving speed of the robot 432 may be increases in proportional to the number of wafers W to be treated. When the number of wafers W to be treated is about 1,000 sheets, the robot 432 may be controlled to increase in moving speed than a case of about 500 sheets of wafers W. The controller 650 may previously set the moving speed of the robot 432 to correspond to the number of wafers W to be treated for the preset period. Then, the controller 650 receives the number of wafers W to be treated to control the moving speed of the robot 432 to a moving speed corresponding to the received number of wafers W.

As described above, in the coating robot 432, the hand 434 is fixed to the arm 435, and the arm 435 has the flexible structure. Thus, the hand 434 may move in a horizontal direction. The arm 435 may linearly move along the support 436 having the longitudinal direction in the third direction 16. The arm 435 may rotate about the support 436. The mounting board 437 to which the support 436 is fixedly coupled may move along the guide rail 433 in the first direction 12. The controller 650 may control at least one speed of a linear moving speed of the mounting board 437 in the first direction 12, a linear moving speed of the arm 435 in the third direction 16, a rotational speed of the arm 435, and a moving speed of the arm 435 in the horizontal direction to correspond to the number of wafers W to be process-treated for the preset period.

According to an embodiment, the controller 650 may control a moving speed of only one of the components of the coating robot 432. In this case, the controller 650 may control a moving speed of the component having the longest moving distance. For example, when a distance at which the mounting board 437 linearly moves along the guide rail 433 in the first direction 12 is longer than each of a linear moving distance of the arm 435 in the third direction 16, a rotational distance of the arm 345, and a horizontal moving distance of the arm 435, the controller 650 may control only a linear moving speed of the mounting board 437 in the first direction 12. The mounting board 437 is controlled in moving speed according to the number of wafers W to be treated. On the other hand, the arm 435 may be uniformly maintained in linear moving speed, rotational speed, and horizontal moving speed regardless of the number of wafers W to be treated.

According to another embodiment, the controller 650 may control moving speeds of all of the components of the coating robot 432. In this case, the controller 650 may control a linear moving speed of the mounting board 437 in the first direction, a linear moving speed of the arm 435 in the third direction, a rotational speed of the arm 435, and a horizontal moving speed of the arm 435 according to the number of wafers W to be process-treated for the preset period.

Figure 5:
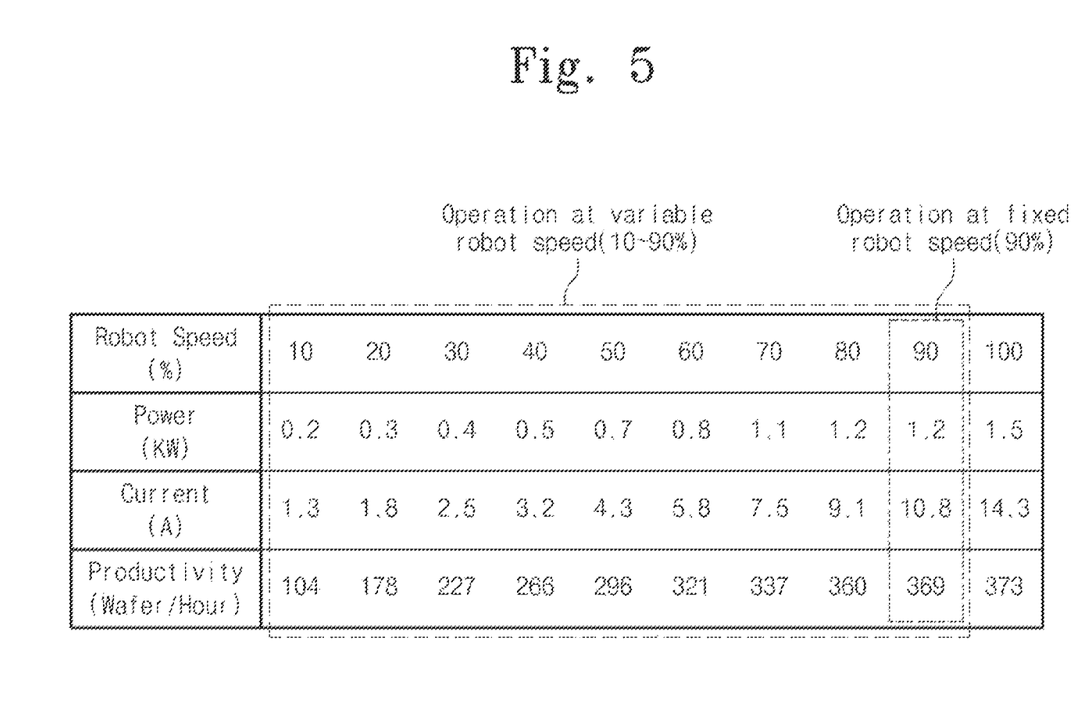
FIG. 5 is a graph of a power consumption variation and productivity according to a speed control of a robot.

FIG. 5 is a graph of a power consumption variation and productivity according to a speed control of a robot.

Referring to FIG. 5, a robot speed may be controlled within a range of about 100% to about 10% of a maximum speed. Also, it is seen that power consumption may occur according to the magnitude in robot speed. Productivity may present a wafer throughput per unit time.

According to an embodiment, a worker may maintain the robot speed at a high speed regardless of the wafer productivity. If 104 sheets of wafers or 369 sheets of wafers are treated, the robot speed may be maintained at about 90% of the maximum speed. In this case, power consumption of about 1.2 KW may occur for driving the robot regardless of the wafer productivity.

On the other hand, the worker may control the robot speed in proportion to the wafer productivity. When the 104 sheets of wafers are treated, the robot speed may be maintained at about 10% of the maximum speed. Also, when the 369 sheets of wafers are treated, the robot speed may be maintained at about 90% of the maximum speed. In this case, when the 104 sheet of wafers are treated, power of about 0.2 KW may be consumed. Also, when the 369 sheets of wafers are treated, power of about 1.2 KW may be consumed.

Comparing the two control methods to each other in the case where the 104 sheets of wafers are manufactured, it is seen that the power consumption decreases in the case where the robot is controlled in speed according to the wafer productivity when compared to that in which the robot speed is maintained at a high speed. The worker may adequately control the moving speed of the robot according to the wafer productivity to previously prevent energy from being unnecessarily consumed.

Figure 6:
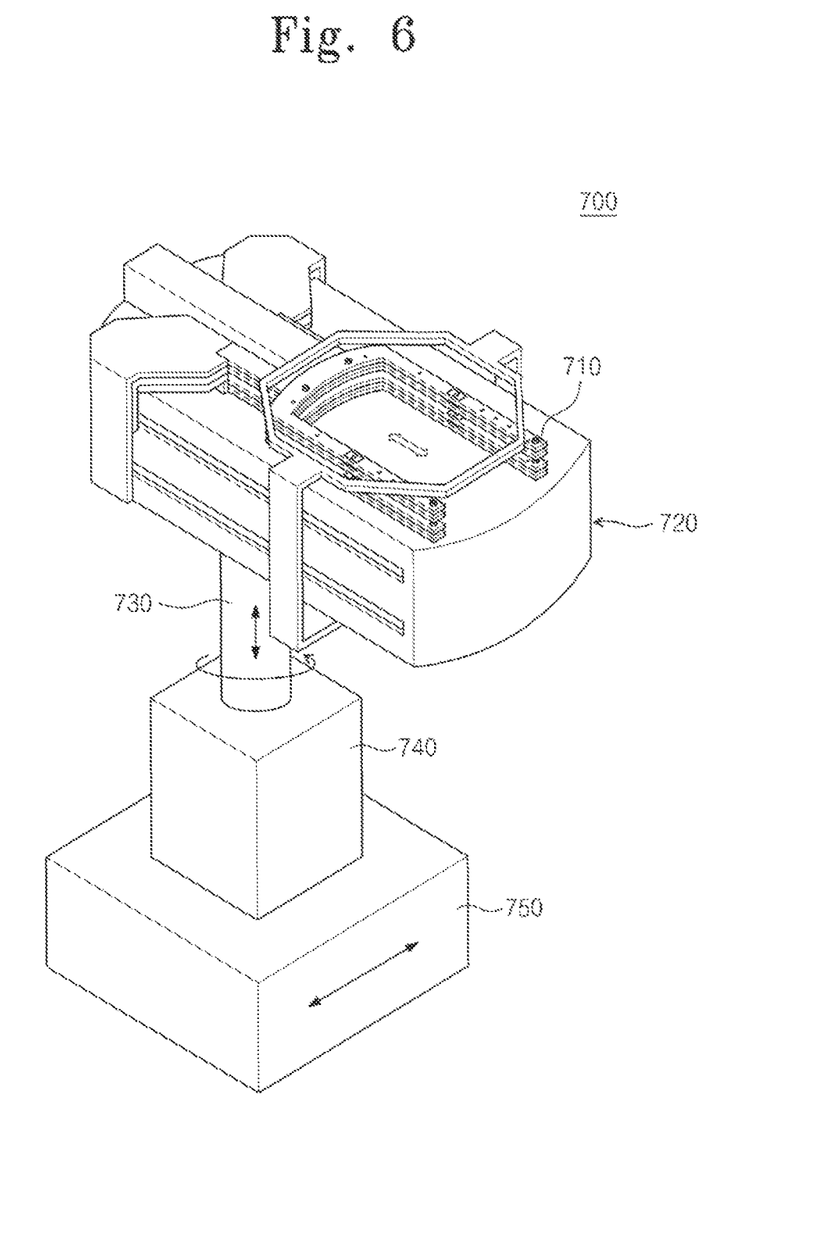
FIG. 6 is a perspective view of a transfer unit according to another embodiment of the present invention.

FIG. 6 is a perspective view of a transfer unit according to another embodiment of the present invention.

Referring to FIG. 6, a transfer robot 700 may include a plurality of hands 710, a hand driving unit 720, a support 730, a vertical moving unit 740, and a horizontal moving unit 750.

The hands 710 may be disposed to face each other. Also, one sheet of wafer W may be loaded on one hand 710. Although four hands 710 are provided in FIG. 6, the present invention is not limited thereto. For example, the number of hands 710 may increase according to process efficiency. The hands 710 may horizontally move by the hand driving unit 720. The hands 720 may individually move by the hand driving unit 720. The support 730 is disposed under the hand driving unit 720 to support the hand driving unit 720. The hand driving unit 720 rotates by the support 730. Thus, the hands 710 rotate together with the hand driving unit 720.

The vertical moving unit 740 is coupled to the support 730 to allow the support 730 to vertically move. Thus, the hand driving unit 720 and the hands 710 may vertically move and thus be adjust in height. The horizontal moving unit 750 is coupled to a lower end of the vertical moving unit 740 and linearly moves along the transfer rail (not shown) in a horizontal direction.

The transfer robot 700 may be controlled in speed by a controller 650. As described above, the controller 650 may control a moving speed of the transfer robot 700 according to the number of wafers W to be treated for a preset period. The controller 650 may control at least one speed of a horizontal moving speed of each of the hands 710, a vertical moving speed of the support 730, a rotational speed of the support 740, and a horizontal moving speed of the horizontal moving unit 750. Since a method for controlling a speed of the transfer robot 700 by using the controller 650 is the same as that for controlling the speed of the coating robot 432, its detailed descriptions will be omitted.

Although the transfer unit transfers the wafer W in the substrate treating apparatus for performing the coating or developing processes in the above-described embodiments, the present invention is not limited thereto. For example, the transfer unit may be provided in apparatuses for performing various processes. That is, the transfer unit may transfer wafers in a substrate cleaning apparatus for cleaning the wafers W.

According to the present invention, the power for driving the transfer unit may be saved.

The above detailed description exemplifies the present invention. Further, the above contents just illustrate and describe preferred embodiments of the present invention and the present invention can be used under various combinations, changes, and environments. That is, it will be appreciated by those skilled in the art that substitutions, modifications and changes may be made in these embodiments without departing from the principles and spirit of the general inventive concept, the scope of which is defined in the appended claims and their equivalents. The above-mentioned embodiments are used to describe a best mode in implementing the present invention. The present invention can be implemented in a mode other than a mode known to the art by using another invention and various modifications required a detailed application field and usage of the present invention can be made. Therefore, the detailed description of the present invention does not intend to limit the present invention to the disclosed embodiments. Further, the appended claims should be appreciated as a step including even another embodiment.

What is claimed is:

1. A transfer unit comprising:
   a robot transferring a substrate; and
   a controller controlling a speed of the robot according to the number of substrates to be transferred by the robot for a preset period,
   wherein, the number of substrates to be transferred for the preset period increases, the robot increases in moving speed by the controller.

2. The transfer unit of claim 1, wherein the controller presets the moving speed of the robot to correspond to the number of substrates to be transferred for the preset period, and when the number of substrates is inputted, the robot moves at the preset moving speed.

3. The transfer unit of claim 1, further comprising a guide rail disposed in one direction,
   wherein the robot comprises:
   a mounting board that is linearly movable along the guide rail;
   a support disposed vertically and coupled to the mounting board;
   an arm vertically movable along the support, the arm being rotatable about the support and movable forward and backward; and
   a hand on which the substrate is placed, the hand being coupled to a front end of the arm,
   wherein the controller controls only one speed of a linear moving speed of the mounting board, a vertical moving speed of the arm, a rotational speed of the arm, and a forward/backward moving speed of the arm so that the one speed increases.

4. The transfer unit of claim 3, wherein the controller controls a moving speed of the component having the longest moving distance in the linear moving speed of the mounting board, the vertical moving speed of the arm, the rotational speed of the arm, and the forward/backward moving speed of the arm so that the moving speed of the component increases.

5. The transfer unit of claim 1, further comprising a guide rail disposed in one direction,
   wherein the robot comprises:
   a mounting board that is linearly movable along the guide rail;
   a support disposed vertically and coupled to the mounting board;
   an arm vertically movable along the support, the arm being rotatable about the support and movable forward and backward; and
   a hand on which the substrate is placed, the hand being coupled to a front end of the arm,
   wherein the controller controls at least one moving speed of a linear moving speed of the mounting board, a vertical moving speed of the arm, a rotational speed of the arm, and a forward/backward moving speed of the arm so that the at least one moving speed increases.

6. The transfer unit of claim 1, further comprising a guide rail disposed in one direction,
   wherein the robot comprises:
   a plurality of hands on which the substrate is placed, the plurality of hands being disposed to face each other;
   a hand driving unit allowing the hands to horizontally move;
   a support supporting the hand driving unit;
   a vertical moving unit allowing the support to vertically move and rotate; and
   a horizontal moving unit supporting the vertical moving unit, the horizontal moving unit being movable along the guide rail,
   wherein the controller controls at least one speed of a horizontal moving speed of each of the hands, a vertical moving speed of the support, a rotational speed of the support, and a moving speed of the horizontal moving unit so that the at least one speed increases.

7. The transfer unit of claim 1, wherein the controller changes the moving speed of the robot in proportion to the number of substrates to be treated for the preset period.

8. A substrate treating apparatus comprising:
   a plurality of chambers in which processes with respect to a substrate are performed; and
   a transfer unit transferring the substrate to the chambers,
   wherein the transfer unit comprises:
   a guide rail disposed in one direction;
   a robot moving along the guide rail, the robot transferring the substrate; and
   a controller controls a speed of the robot according to the number of substrates to be treated in the chambers for a preset period.

9. The substrate treating apparatus of claim 8, wherein the controller controls the moving speed of the robot so that the moving speed of the robot increases as the number of substrates to be process-treated in the chamber for the preset period increases.

10. The substrate treating apparatus of claim 8, wherein the controller presets the moving speed of the robot to correspond to the number of substrates to be process-treated in the chambers for the preset period, and when the number of substrates is inputted, the robot moves at the preset moving speed.

11. The substrate treating apparatus of claim 8, wherein the robot comprises:
a mounting board that is linearly movable along the guide rail;
a support disposed vertically and coupled to the mounting board;
an arm vertically movable along the support, the arm being rotatable about the support and movable forward and backward; and
a hand on which the substrate is placed, the hand being coupled to a front end of the arm,
wherein the controller controls at least one moving speed of a linear moving speed of the mounting board, a vertical moving speed of the arm, a rotational speed of the arm, and a forward/backward moving speed of the arm so that the at least one moving speed increases.

12. The substrate treating apparatus of claim 11, wherein the controller controls a moving speed of the component having the longest moving distance in the linear moving speed of the mounting board, the vertical moving speed of the arm, the rotational speed of the arm, and the forward/backward moving speed of the arm so that the moving speed of the component increases.

13. The substrate treating apparatus of claim 8, wherein the robot comprises:
a plurality of hands on which the substrate is placed, the plurality of hands being disposed to face each other;
a hand driving unit allowing the hands to horizontally move;
a support supporting the hand driving unit;
a vertical moving unit allowing the support to vertically move and rotate; and
a horizontal moving unit supporting the vertical moving unit, the horizontal moving unit being movable along the guide rail,
wherein the controller controls at least one speed of a horizontal moving speed of each of the hands, a vertical moving speed of the support, a rotational speed of the support, and a horizontal moving speed of the horizontal moving unit so that the at least one speed increases.

14. The substrate treating apparatus of claim 13, wherein the controller changes a moving speed of the component having the longest moving distance in the horizontal moving speed of each of the hands, the vertical moving speed of the support, the rotational speed of the support, and the horizontal moving speed of the horizontal moving unit so that the moving speed of the component increases.

15. A method for controlling a speed of a robot for transferring a substrate, the method comprising:
controlling a moving speed of a robot according to the number of substrates to be treated for a preset period,
wherein, when the number of substrates to be treated for the preset period increases, the robot increases in moving speed.

16. The method of claim 15, wherein the moving speed of the robot is preset to correspond to the number of substrates to be treated for the preset period, and when a controller receives the number of substrates, the controller controls the robot so that the robot moves at the preset moving speed.

17. The method of claim 15, wherein the preset period is a day unit.

18. The method of claim 15, wherein the robot comprises a mounting board, a support, an arm, and a hand,
wherein at least one moving speed of a horizontal moving speed of the mounting board along the guide rail in a horizontal direction, a vertical moving speed of the arm along the support coupled to the mounting board in a vertical direction, a rotational speed of the arm about the support, and a linear moving speed of the hand in forward and backward directions due to contraction of the arm is controlled to increase.

19. The method of claim 18, wherein the moving speed of the component having the longest moving distance in the horizontal moving speed, the vertical moving speed, the rotational moving speed, and the linear moving speed is controlled to increase.

20. The method of claim 18, wherein the moving speed of the robot is changed to increase in all of the horizontal moving speed, the vertical moving speed, the rotational moving speed, and the linear moving speed.

21. The method of claim 15, wherein the moving speed of the robot increases in proportion to the number of substrates to be treated for the preset period.

22. A method for treating a plurality of substrates for a preset period, the method comprising:
moving a robot to provide each of substrates to a chamber; and
treating the substrate in the chamber,
wherein the robot is controlled in moving speed according to the number of substrates to be treated for the preset period.

23. The method of claim 22, wherein the moving speed of the robot is preset to correspond to the number of substrate, and when a controller receives the number of substrates, the controller controls the robot so that the robot moves at the preset moving speed.

24. The method of claim 22, wherein the moving speed of the robot increases in proportion to the number of substrates to be treated for the preset period.

* * * * *